United States Patent [19] [11] 3,883,352

Kloczewski et al. [45] May 13, 1975

[54] PROCESS FOR FORMING A PHOTOCURED SOLDER RESIST

[75] Inventors: Harold A. Kloczewski, Pasadena; William R. Schaeffer, Baltimore, both of Md.

[73] Assignee: W. R. Grace & Co., New York, N.Y.

[22] Filed: May 3, 1974

[21] Appl. No.: 466,588

Related U.S. Application Data

[60] Continuation-in-part of Ser. No. 348,378, April 5, 1973, abandoned, Division of Ser. No. 363,453, May 24, 1973, Pat. No. 3,824,109.

[52] U.S. Cl. .................................. 96/35.1; 96/115 R

[51] Int. Cl. ............................................. G03c 5/00

[58] Field of Search ............ 96/35.1, 115 P, 115 R, 96/36.2; 204/159.13, 159.19, 159.15

[56] References Cited

UNITED STATES PATENTS

| | | | |
|---|---|---|---|
| 3,376,139 | 4/1968 | Giangualano et al. | 96/35.1 |
| 3,462,267 | 8/1969 | Giangualano et al. | 96/35.1 |
| 3,615,450 | 10/1971 | Werber et al. | 96/35.1 |
| 3,619,393 | 11/1971 | Stahly | 204/159.15 |
| 3,701,721 | 10/1972 | Lard | 204/159.16 |
| 3,708,413 | 1/1973 | Kehr et al. | 204/159.14 |
| 3,753,720 | 8/1973 | Kloczewski et al. | 96/115 R |
| 3,767,398 | 10/1973 | Morgan | 96/36.2 |
| 3,770,491 | 11/1973 | Spoor et al. | 204/159.15 |

*Primary Examiner*—Ronald H. Smith
*Assistant Examiner*—Edward c. Kimlin
*Attorney, Agent, or Firm*—Richard P. Plunkett; Kenneth E. Prince

[57] ABSTRACT

This invention relates to a heat and solder resistant solid photopolymer composition which can be imaged and developed and a process of using same. The solder resistant photocurable composition consists essentially of a solid diallyl phthalate prepolymer, i.e. poly(diallyl orthophthalate) and a liquid polyene and polythiol. The solid composition when applied to a printed circuit board and cured imagewise in the presence of a free radical generator permits passage of the board through a bath of molten solder to secure electrical components thereto. When the free radical generator is actinic radiation, e.g., UV light, a curing rate accelerator, e.g., benzophenone is usually added to the composition.

3 Claims, No Drawings

PROCESS FOR FORMING A PHOTOCURED SOLDER RESIST

This application is a continuation-in-part of copending application having Ser. No. 348,378, filed Apr. 5, 1973, now abandoned. This is a division of application Ser. No. 363,453, filed May 24, 1973, now U.S. Pat. No. 3,824,109.

This invention relates to a solid solder resistant photopolymer composition and a process which permits soldering of electrical or electronic components to printed circuit boards in a molten solder bath.

The soldering of electrical components to a printed circuit board is a multi-step, time-consuming task. More precisely, before the electrical components can be soldered to the board, the following steps must be carried out. An insulating board such as epoxy fiberglas board must be copper-clad. The copper-clad board is then drilled through at predetermined sites. The boards are then deburred and cleaned and the cladding is washed in ammonium persulfate solution and then in water, 5–10 percent $H_2SO_4$ solution or other solvent to remove excess ammonium persulfate. A catalyst is then applied to the board for electroless deposition of copper to coat not only the inside of the drilled holes, but also the entire board. Following electroless deposition of copper, additional copper is put on the board and in the holes by electroplating. The thus electroplated copper is then covered with a conventional photoresist and exposed imagewise through a printed circuit transparency to UV light, thus curing (hardening) the exposed portion of the photoresist. The unexposed portion of the photoresist is washed off, exposing the copper thereunder, i.e., where the lands, wiring conductors and connecting pads are formed. Positive working resists can also be used, if desired at this stage. The thus exposed copper circuit is then electroplated in a tin-lead plating bath, thereby coating solder onto the exposed copper on the board and in the holes. The cured photoresist is then stripped in a solvent and/or by mechanical means and the copper under the cured photoresist is etched away in a conventional copper etching bath. It is at this point that one can then commence the sequence of steps necessary to solder electrical components to the circuit board.

Present day technique employed for soldering electrical components to a circuit board are being made obsolete by space limitations. The trend toward smaller and more functional computer systems is shrinking the size of the boards, making the lines and pads smaller and closer together. In addition, the increased functionality is requiring more multilayers for connections. Diminished size also means shorter distances between components and therefore faster speed of computer operation. Manufacturers presently solder by passing the board, coated with a heat cured screen printed solder resistant ink, through a wave soldering machine to allow the thousands of connections to be made quickly. However, the limitations on screen printing are already apparent on large (24 inches × 20 inches) multilayer computer platters. The next generation of computers will require line spacings which are totally beyond screen printing; therefore, a need for a solder resistant photoresist exists. To overcome the drawbacks of solder resist inks, liquid photosensitive materials have been added to the art. However liquid photosensitive compositions have the drawback that on boards which have to be processed on both sides, one must carry out the sequence of applying the composition to the board, exposing imagewise and developing on one side of the board before the board can be turned over to repeat the operation. A solid solder resist permits double side application, exposure and development simultaneously.

One object of the instant invention is to produce a solid solder resistant composition. Another object of the invention is to produce a photocurable solder resistant composition which can be applied and photocured, imagewise, in register with sufficient accuracy to meet the requirements of the next generation of printed circuit boards. Still another object of the instant invention is to produce a photocurable solder resistant composition which, in its cured state, is capable of withstanding molten soldering bath temperatures in the range of 400°–600°F. A still further object of this invention is to produce a process employing the solder resistant photopolymer compositions which can be applied with sufficient accuracy to meet the next generation of printed circuit boards. Yet another object of this invention is to produce a process whereby the solid solder resist on both sides of the printed circuit board can be applied, exposed and developed simultaneously.

The critical ingredients in the solder resistant photopolymer composition are:

1. 5 to 40 parts by weight of a polythiol containing at least two thiol groups per molecule;
2. 60–95 parts by weight of poly-(diallyl orthophthalate), the sum of (1) and (2) being 100 parts by weight;
3. 1 to 20 parts by weight based on the weight of (1) and (2) of a liquid polyene of the formula:

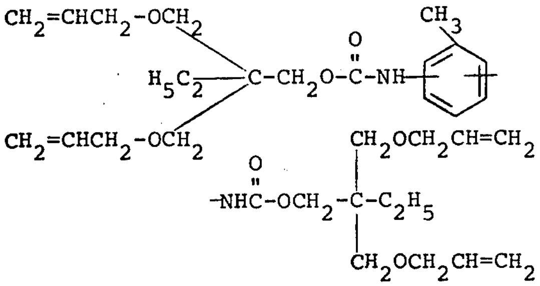

and 4. 0.05 to 10 parts by weight based on the weight of (1) and (2) of a photocuring rate accelerator.

It is to be understood, however, that when energy sources other than visible or ultraviolet light are used to initiate the curing reaction, i.e. high energy ionizing radiation, photocuring rate accelerators (i.e., photosensitizers, etc.) generally are not required in the formulation. That is to say, the actual composition of the photocuring rate accelerator, if required at all, varies with the type of energy source that is used to initiate the curing reaction.

It is to be understood that aside from the presence of a photocuring rate accelerator which depends upon the energy source, it is critical that the other components of the composition be present to obtain an operable photocurable solder resistant photoresist. That is, without the solid poly-(diallyl orthophthalate) and the polythiol being present, no photocurable solder resist results. Furthermore the solid poly-(diallyl orthophthalate) being present in a major amount insures that the photocurable composition is a solid even though minor amounts of liquid polyene and polythiol are added to the composition. This allows the image bearing negative to be placed in direct contact with the "Mylar" substrate thus affording higher resolution on exposure and also allows simultaneous application, exposure and development on both sides of the printed circuit board.

The liquid polyene operable in the instant invention is set out supra. The function of the liquid polyene is two fold. It not only takes part in the crosslinking reaction with the polythiol but also, more importantly, affords sufficient adhesiveness to the composition to allow it to operate as a solder resist. That is, absent the liquid polyene from the composition, the cured composition on passing through the heated solder bath bubbles up and separates from the board as will be shown in an example hereinafter.

The amount of the liquid polyene added to the formulation is critical. That is if amounts in excess of the upper limit set out herein are added, then the material no longer is a solid and thus precludes simultaneous application, exposure and development on both sides of the board. If an amount less than the lower limit of the liquid polyene is added then insufficient adhesion is obtained and the photoresist bubbles up and fails to adhere to the board.

Various photosensitizers, i.e. photocuring rate accelerators are operable and well known to those skilled in the art. Examples of photosensitizers include, but are not limited to benzophenone, acetophenone, acenapthenequinone, methyl ethyl ketone, valerophenone, hexanophenone, γ-phenylbutyrophenone, p-morpholinopropionphenone, dibenzosuberone, 4-morpholinobenzophenone, 4′-morpholinodeoxybenzoin, p-diacetylbenzene, 4-aminobenzophenone, 4′-methoxyacetophenone, benzaldehyde, α-tetralone, 9-acetylphenanthrene, 2-acetylphenanthrene, 10-thioxanthenone, 3-acetylphenanthrene, 3-acetylindole, 9-fluorenone, 1-indanone, 1, 3, 5-triacetylbenzene, thioxanthen-9-one, xanthene-9-one, 7-H-benz[de]anthracen-7-one, 1-naphthaldehyde, 4,4′-bis(dimethylamino)benzophenone, fluorene-9-one, 1′-acetonaphthone, 2′-acetonaphthone and 2,3-butanedione, etc., which serve to give greatly reduced exposure times and thereby when used in conjunction with various forms of energetic radiation yield very rapid, commercially practical time cycles by the practice of the instant invention.

As used herein, the term polythiols refers to simple or complex organic compounds having a multiplicity of pendant or terminally positioned —SH functional groups per average molecule.

On the average the polythiols must contain 2 or more —SH groups/molecule. They usually have a viscosity range of 0 to 20 million centipoises (cps) at 70°C as measured by a Brookfield Viscometer. Included in the term "polythiols" as used herein are those materials which in the presence of an inert solvent, aqueous dispersion or plasticizer fall within the viscosity range set out above at 70°C. Operable polythiols in the instant invention usually have molecular weights in the range 50–20,000, preferably 100–10,000.

The polythiols operable in the instant invention can be exemplified by the general formula: $R_8$—$(SH)_n$ where $n$ is at least 2 and $R_8$ is a polyvalent organic moiety free from reactive carbon to carbon unsaturation. Thus $R_8$ may contain cyclic groupings and minor amounts of hetero atoms such as N, S, P or O but primarily contains carbon-hydrogen, carbon oxygen, or silicon-oxygen containing chain linkages free of any reactive carbon to carbon unsaturation.

The polythiols operable in the instant invention can be exemplified by the general formula: $R_8$—$(SH)_n$ where $n$ is at least 2 and $R_8$ is a polyvalent organic moiety free from reactive carbon to carbon unsaturation. Thus $R_8$ may contain cyclic groupings and minor amounts of hetero atoms such as N, S, P or O but primarily contains carbon-hydrogen, carbon oxygen, or silicon-oxygen containing chain linkages free of any reactive carbon to carbon unsaturation.

One class of polythiols operable with polyenes in the instant invention to obtain a polythioether solder resist are esters of thiol-containing acids of the general formula: HS—$R_9$—COOH where $R_9$ is an organic moiety containing no "reactive" carbon to carbon unsaturation with polyhydroxy compounds of the general structure: $R_{10}$—$(OH)_n$ where $R_{10}$ is an organic moiety containing no "reactive" carbon to carbon unsaturation and $n$ is 2 or greater. These components will react under suitable conditions to give a polythiol having the general structure $$R_{10}-(O\underset{\underset{\displaystyle O}{\|}}{C}-R_9-SH)_n$$

where $R_9$ and $R_{10}$ are organic moieties containing no "reactive" carbon to carbon unsaturation and $n$ is 2 or greater.

Certain polythiols such as the aliphatic monomeric polythiols (ethane dithiol, hexamethylene dithiol, decamethylene dithiol, tolylene-2,4-dithiol, etc.) and some polymeric polythiols such as thiol-terminated ethylcyclohexyl dimercaptan polymer, etc. and similar polythiols which are conveniently and ordinarily synthesized on a commercial basis, although having obnoxious odors, are operable in this invention but many of the end products are not widely accepted from a practical, commercial point of view. Examples of the polythiol compounds preferred for this invention because of their relatively low odor level include, but are not limited to, esters of thioglycolic acid (HS—$CH_2COOH$), α-mercaptopropionic acid (HS—$CH(CH_3)$—COOH) and β-mercaptopropionic acid (HS—$CH_2COOH$) with polyhydroxy compounds such as glycols, triols, tetraols, pentaols, hexaols, etc. Specific examples of the preferred polythiols include, but are not limited to, ethylene glycol bis (thioglycolate), ethylene glycol bis (β-mercaptopropionate), trimethylolpropane tris (thioglycolate), trimethylolpropane tris (β-mercaptopropionate), pentaerythritol tetrakis (thioglycolate), tris (hydroxyethyl) isocyanurate tris (β-mercaptopropionate) and pentaerythritol tetrakis (β-mercaptopropionate), most of which are commercially available. A specific example of a preferred polymeric polythiol is polypropylene ether gylcol bis (β-mercaptopropionate) which is prepared from polypropylene ether glycol (e.g., Pluracol P2010, Wyandotte Chemical Corp.) and β-mercaptopropionic acid by esterification.

The preferred polythiol compounds are characterized by a low level of mercaptan-like odor initially, and after reaction, give essentially odorless polythioether end products which are commercially attractive.

The term "functionality" as used herein refers to the average number of ene or thiol groups per molecule in the solid or liquid polyene or polythiol, respectively. For example, a tetraene is a polyene with an average of four "reactive" carbon to carbon unsaturated groups per molecule and thus has a functionality ($f$) of 4. A dithiol is a polythiol with an average of two thiol groups per molecule and thus has a functionality ($f$) of 2.

To obtain the maximum strength, solvent resistance, creep resistance, heat resistance and freedom from tackiness, the reactive components consisting of the polyenes and polythiol in combination with the curing rate accelerator of this invention are formulated in such a manner as to give solid, crosslinked, three dimensional network polythioether polymer systems on curing. In order to achieve such infinite network formation, the individual polyenes and polythiol must each have a functionality of at least 2 and the sum of the functionalities of the polyene and polythiol components must always be greater than 4.

The solid solder resistant photopolymer compositions to be cured, in accord with the present invention may, if desired, include such additives as stabilizers, antioxidants, accelerators, dyes, inhibitors, activators, fillers, pigments, anti-static agents, flame-retardant agents, surface-active agents, extending oils, plasticizers, and the like within the scope of this invention. Such additives are usually preblended with the polyene or polythiol prior to or during the compounding step. The aforesaid additives may be present in quantities up to 500 or more parts based on 100 parts by weight of the polyene/polythiol solder resist compositions and preferably 0.005–300 parts on the same basis.

To insure that the reaction does not precure prior to use, stabilizers are usually added to the polyene prior to admixture with the polythiol. Operable stabilizers include various well known commercially available materials such as octadecyl β(4-hydroxy-3,5-di-t-butylphenyl) propionate commercially available from Geigy Chemical Co., under the tradename "Irganox 1076;" 2,6-ditertiary-butyl-4-methylphenol commercially available under the tradename "Ionol" from Shell Chemical Co., pyrogallol, phosphorous acid, hydroquinone and the like. The stabilizers are usually added in amounts ranging from 0.01 to 5.0 parts per 100 parts by weight of the poly-(diallyl orthophthalate)/polythiol composition.

To facilitate handling and application the solid solder resistant photocurable composition is cast in a solvent on a UV transparent film substrate, dried and covered with a protective plastic cover sheet, e.g. polyethylene which can be then rolled up. The poly-(diallyl orthophthalate), polythiol and liquid polyene along with a curing rate accelerator, dye and any stabilizers desired are mixed in an equal weight of a solvent for these materials. Ethylene dichloride is an operable solvent for the solder resist materials, however other well known solvents including but not limited to methylene chloride, chloroform, 1,1,1-trichloroethane, mono, o-di and trichlorobenzene and the like, are operable. The reactants can be added to the solvent in any order but preferably the polyenes both liquid and solid are added first followed by stabilizers therefor with the remainder of the materials being added thereafter. The admixing is carried out at room temperature although slightly elevated temperatures can be employed if desired. After the solution is homogeneous it is coated onto a UV transparent substrate, e.g. a 1 mil thick film of polyethylene terephthalate, i.e. "Mylar." The "Mylar" is placed on a tempered glass plate which is heated to 70°–80°C and the material is applied by a calibrated draw bar drawn across the surface to apply a 16 mil thick coating. The wet coating is then dried for 1 to 3 hours at 70°–80°C resulting in an approximately 8 mil thick photocurable solder resist composition on the "Mylar" substrate. After drying the coated substrate is covered with a protective polyethylene film (2 mil thick), rolled up on a take-up roll and is ready for use.

The preferred means of curing is by means of electromagnetic radiation of wavelength of about 2000–4000 A (because of simplicity, economy and convenience). The polyene-polythiol solder resistant composition of the instant invention can be cured also by imagewise directed beams of ionizing irradiation.

When UV radiation is used for the curing reaction, an intensity of 0.004 to 6.0 watts/cm$^2$ is usually employed.

Unless otherwise noted herein, all parts and percentages are by weight. The following examples will explain but expressly not limit the instant invention.

EXAMPLE I

Preparation of Liquid Polyene

A round bottom flask is fitted with a stirrer, thermometer, dropping funnel, nitrogen inlet and outlet. The flask can be placed in a heating mantle or immersed in a water bath as required.

Two moles (428 gms.) of trimethylol-propane diallyl ether were mixed with 0.2 cc. of dibutyl tin dilaurate under nitrogen. One mole of tolylene -2,4-diisocyanate was added to the mixture, using the rate of addition and cooling water to keep the temperature under 70°C. The mantle was used to keep the temperature at 70°C. for another hour. Isocyanate analysis showed the reaction to be essentially complete at this time resulting in the following viscous liquid polyene product:

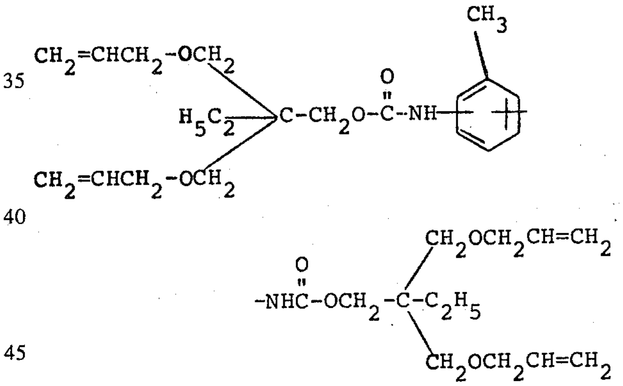

which will be referred to hereinafter as Prepolymer A.

EXAMPLE II 10 parts by weight of the liquid polyene from Example I (Prepolymer A), 80 parts by weight of commercially available poly-(diallyl orthophthalate) and as stabilizers, 0.2 parts by weight of phosphorous acid, 0.044 parts hydroquinone, and 0.015 parts pyragallol were admixed with 20 parts by weight of pentaerythritol tetrakis (β-mercaptopropionate) commercially available from Carlisle Chemical Co. under the tradename of "Q-43," 0.1 part by weight of sudan green dye and 8.0 parts by weight benzophenone in 110 parts by weight of ethylene dichloride. The mixture was stirred at room temperature for one-half hour at which time all ingredients were in solution. The photocurable solution was then coated onto a 1 mil thick "Mylar" film extended on a tempered glass plate which was heated to 76°C. A calibrated draw bar set so as to coat a 16 mil thick coating was drawn across the photocurable composition. After drying for 75 minutes at 76°C, an 8 mil thick film of the dried solid photocurable composition resulted. The dried coating was covered with a 2 mil thick polyethylene protective cover sheet and the laminate was rolled up on two take-up rolls. The rolls were placed in a Dupont Laminating Machine, the polyethylene cover sheets removed and the coated "Mylar" substrates were laminated to both sides of a drilled printed circuit board (coated surface being laminated to the board) at a temperature of 160°F and a speed of three-fourths feet per minute. The board prior to coating had been electroless plated and electrolytically plated with copper followed by an electrolytic plating of tin-lead over the etched copper circuit thereon on both sides of the board. The photocurable composition on both sides of the board was exposed through a transparency imaged in the pad areas and in contact with the "Mylar" substrate, to a 275 watt Westinghouse U.V. sunlamp at a surface intensity on the composition of 4,000 microwatts/cm$^2$ for 7 minutes. The major spectral lines of the sunlamp were all above 3000 angstroms. The "Mylar" substrate was then stripped off both sides of the board leaving the composition on the board and the images on the board surface were developed by spraying with 0-dichlorobenzene for 4 minutes. The resulting resolution was excellent. The board was then washed with water for 1 minute and air dried at 75°C for 15 minutes. The dried board was then baked in an air oven at 120°C for 35 minutes.

The leads of electrical components were inserted through the holes in the board. Using a standard commercially available solder machine, the board was then passed over foaming flux, i.e. "Reliavos" 346-35, a fast drying activated rosin flux commercially available from Alphametals Inc., Jersey City, New Jersey, to coat the pad areas to be soldered with the flux. The board was then conveyed over a preheater maintained at a temperature sufficient to raise the temperature of the circuit board to the range 210°–225°F and then over a solder bath maintained at 500°F. The solder is then splashed on the under side of the board, thereby soldering the leads extending therethrough to the board. The printed circuit boards with the electrical components soldered thereto are then washed in 1,1,1-trichloroethane to remove the flux and then dried. Inspection of the board showed that the cured composition was unaffected by the soldering steps and adhered well to the board.

EXAMPLE III

Example II was repeated except that the 10 parts by weight of the liquid tetraene from Example I (Prepolymer A) was omitted from the formulation.

Inspection of the board after passing through the solder bath showed that the solder resist coating was bubbled up over the entire board due to its poor adhesion.

EXAMPLE IV 47 parts by weight of the liquid tetraene from Example I (Prepolymer A) containing as stabilizers 0.2 parts by weight phosphorous acid, 0.044 parts hydroquinone and 0.015 parts pyragallol were admixed with 38 parts by weight of pentaerythritol tetrakis (β-mercaptopropionate), 0.1 parts by weight of sudan green dye and 8 parts by weight benzophenone. The admixture was heated to 60°C to disolve the stabilizers in the tetraene. The viscous liquid admixture was coated onto the entire surface of one side of a drilled printed circuit board to a thickness of 8 mils by means of a calibrated draw bar. The board prior to coating had been electroless plated and electrolytically plated with copper followed by an electrolytic plating of tin lead over the etched copper circuit thereon on both sides of the board. The photocurable composition was exposed through a transparency imaged in the pad areas (with an air gap of 8 mils between the liquid composition and the transparency) to a 275 watt Westinghouse UV sunlamp at a surface intensity on the photocurable composition of 4000 microwatts/cm$^2$ for 1 minute. The major spectral lines of the sunlamp were all above 3000 angstroms. Such exposure caused curing and solidification of the exposed photocurable solder resist composition. The unexposed photocurable composition was removed by washing in an aqueous detergent solution containing sodium metasilicate and polyoxyethylene (15) tridecyl ether. The coating, imaging and development steps were repeated on the other side of the board. Inspection of the board at this point showed poor resolution due to the necessity of maintaining an air gap between the image transparency and the liquid photocurable composition. Additionally it was noted that the liquid photocurable composition had entered some of the holes in the board and cured therein thus necessitating its removal prior to inserting electrical components in the holes. If the cured material is not removed from the holes completely, poor soldering joints result. Leads of electrical components were inserted through the holes in the board. Using a standard commercially available solder maching; the board was passed over foaming flux, i.e. "Reliavos" 346-35, a fast drying activated rosin flux commercially available from Alphametals, Inc., Jersey City, New Jersey, to coat the pad areas to be soldered. The board was then conveyed over a preheater maintained at a temperature of 700°F and then over a solder bath maintained at a temperature sufficient to raise the temperature of the circuit board to the range 210°–225°F. The solder splashing on the underside of the board soldered the leads extending therethrough to the board. The board was then washed in water to remove the flux and then dried. Although adhesion of the solder resist to the board appeared good it should be noted that since the photocurable solder resist is a liquid composition, it was necessary to coat, expose and develop one side of the board prior to carrying out these steps on the other side of the board thus necessitating a doubling of the time cycle as compared to a solid solder resist.

In practicing the instant invention the photocurable solder resist is usually applied so as to obtain a dried solid layer having a thickness in the range 4 to 10 mils.

EXAMPLE V

Example II was repeated except that the photocurable solder resist composition was as follows:

- 2.6 parts by weight of the liquid polyene from Example I (Prepolymer A);
- 90 parts by weight of commercially available poly(diallyl orthophthalate);
- 10 parts by weight pentaerythritol tetrakis (β-mercaptopropionate;
- 0.1 part by weight of sudan green dye and 7.4 parts by weight benzophenone in 100 parts by weight of ethylene dichloride;
- 0.044 parts by weight hydroquinone;
- 0.015 parts by weight pyrogallol;
- 0.2 parts by weight phosphorous acid.

Inspection of the board showed that the cured composition was unaffected by the soldering step and adhered well to the board.

EXAMPLE VI

Example II was repeated except that the photocurable solder resist composition was as follows:

1.0 parts by weight of the liquid polyene from Example I (Prepolymer A);
60 parts by weight of commercially available poly-(diallyl orthophthalate);
40 parts by weight of dipentaerythritol hexakismercaptopropionate, commercially available from Evans Chemetics, Inc.;
0.2 parts by weight of sudan green dye and 7.4 parts by weight benzophenone in 100 parts by weight of ethylene dichloride;
0.044 parts by weight hydroquinone;
0.015 parts by weight pyrogallol;
0.2 parts by weight phosphorous acid.

Inspection of the board showed that the cured composition was unaffected by the soldering step and adhered well to the board.

What is claimed is:

1. A process for forming a photocured solder resist on at least one surface of a substrate which comprises:

A. applying to said surface, a layer of a solid photocurable solder resist composition consisting essentially of:
 1. 5 to 40 parts by weight of a polythiol containing at least two thiol groups per molecule;
 2. 60 to 95 parts by weight of poly-(diallyl orthophthalate), the sum of (1) and (2) being 100 parts by weight;
 3. 1 to 20 parts by weight based on the weight of (1) and (2) of a liquid polyene of the formula:

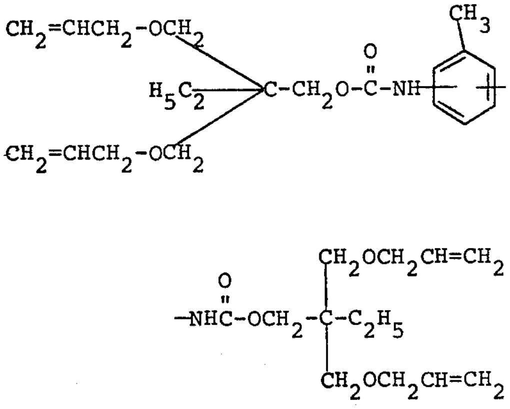

and 4. 0.05 to 10 parts by weight based on the weight of (1) and (2) of a photocuring rate accelerator, B. exposing said composition imagewise to actinic radiation for a time sufficient to insolubilize the exposed portion of said composition and C. removing the unexposed photocurable composition from the surface of said substrate.

2. The process according to claim 1 wherein the substrate has holes therethrough.

3. The process according to claim 2 including the additional steps of passing the leads of electrical components through the holes in the substrate where desired and soldering said components to said substrate with molten solder.

* * * * *